(12) United States Patent
McHugh

(10) Patent No.: US 8,298,379 B2
(45) Date of Patent: Oct. 30, 2012

(54) METHOD AND APPARATUS FOR EXTENDING CHAMBER COMPONENT LIFE IN A SUBSTRATE PROCESSING SYSTEM

(75) Inventor: James A. McHugh, Ballston Lake, NY (US)

(73) Assignee: Tokyo Electron Limited, Tokyo (JP)

( * ) Notice: Subject to any disclaimer, the term of this patent is extended or adjusted under 35 U.S.C. 154(b) by 1052 days.

(21) Appl. No.: 11/689,904

(22) Filed: Mar. 22, 2007

(65) Prior Publication Data

US 2008/0230371 A1 Sep. 25, 2008

(51) Int. Cl.
*C23C 14/00* (2006.01)

(52) U.S. Cl. .................. 204/192.1; 204/298.11

(58) Field of Classification Search ............ 204/298.2, 204/298.11, 192.1
See application file for complete search history.

(56) References Cited

U.S. PATENT DOCUMENTS

| | | | | |
|---|---|---|---|---|
| 5,061,660 | A | * | 10/1991 | Park et al. ................ 501/80 |
| 5,151,295 | A | * | 9/1992 | Kawahara et al. .......... 427/9 |
| 5,598,622 | A | * | 2/1997 | Raaijmakers ............ 29/447 |
| 2007/0158188 | A1 | * | 7/2007 | Ivanov ............... 204/298.02 |

FOREIGN PATENT DOCUMENTS

WO   PCT/US05/19194   *   1/2006

OTHER PUBLICATIONS

Adjacent. 2012. In Merriam-Webster.com. Retrieved Jan. 12, 2012, from www.meriam-webster.com/dictionary/adjacent.*

* cited by examiner

*Primary Examiner* — Keith Hendricks
*Assistant Examiner* — John Brayton
(74) *Attorney, Agent, or Firm* — Oblon, Spivak, McClelland, Maier & Neustadt, L.L.P.

(57) ABSTRACT

A chamber component for a substrate processing system is described. The chamber component comprises a primary member, and a deposit absorbing member coupled to the primary member, wherein the deposit absorbing member comprises a porous material configured to absorb material that is deposited on a surface thereof.

27 Claims, 7 Drawing Sheets

METHOD AND APPARATUS FOR EXTENDING CHAMBER COMPONENT LIFE IN A SUBSTRATE PROCESSING SYSTEM

BACKGROUND OF THE INVENTION

1. Field of Invention

The present invention relates to a method and apparatus for processing a substrate, and more particularly to a method and apparatus for extending the life of a chamber component in a substrate processing system that is susceptible to the accumulation of material deposits.

2. Description of Related Art

During the fabrication of integrated circuits (IC) in the semiconductor manufacturing industry, it is necessary to deposit thin films of material on a substrate and, oftentimes, the film must conform to complex surface topography. For instance, thin film deposition processes are required to metallize back-end-of-line (BEOL) trench/via interconnect structures. These deposition processes can utilize several process technologies, including physical vapor deposition (PVD), ionized PVD (iPVD), chemical vapor deposition (CVD), plasma enhanced CVD (PECVD), atomic layer deposition (ALD), or plasma enhanced ALD (PEALD) in order to produce conformal barrier layers to reduce metal migration in the insulating films and conformal seed layers to facilitate void-less metal fill. The type of deposition process or sequence of deposition processes is generally determined by the requirements of the deposited material, e.g., film conformality, film purity, film mechanical or electrical properties, etc.

The implementation of the aforementioned deposition processes leads to the formation of excess material, such as sputtered adatom (e.g., PVD or iPVD) or excess deposition chemistry (e.g., CVD), on process system surfaces and the accumulation of such deposits from process-to-process. The accumulation of material deposits on various surfaces of chamber components can affect variability in substrate processing results and, hence, can reduce yield. More importantly, excessive deposits can cause catastrophic failure of such deposition systems. Therefore, these depositions systems commonly require frequent cleaning, refurbishment or replacement of various chamber components.

SUMMARY OF THE INVENTION

A method and system is provided for extending the life of a chamber component in a substrate processing system.

According to one embodiment, a chamber component for a substrate processing system is described, comprising: a primary member; and a deposit absorbing member coupled to the primary member, wherein the deposit absorbing member comprises a porous material configured to absorb material that is deposited on a surface thereof.

According to another embodiment, a sputtering system for depositing a thin film on a substrate is described, comprising: a sputtering target coupled to the sputtering system and configured to introduce a sputtered adatom to the sputtering system for deposition on the substrate; and a chamber component coupled to the sputtering system adjacent the sputtering target, wherein the chamber component comprises a primary member and a deposit absorbing member coupled to the primary member on a surface proximate the sputtering target, and wherein the deposit absorbing member comprises a porous material configured to absorb material that is deposited on a surface thereof.

According to yet another embodiment, a method of processing a substrate in a substrate processing system is described, the method comprising: disposing a chamber component within the substrate processing system; coupling a deposit absorbing member to the chamber component, wherein the deposit absorbing member comprises a porous material configured to absorb material that is deposited on a surface thereof in the substrate processing system; providing a substrate in the substrate processing system; and processing the substrate.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
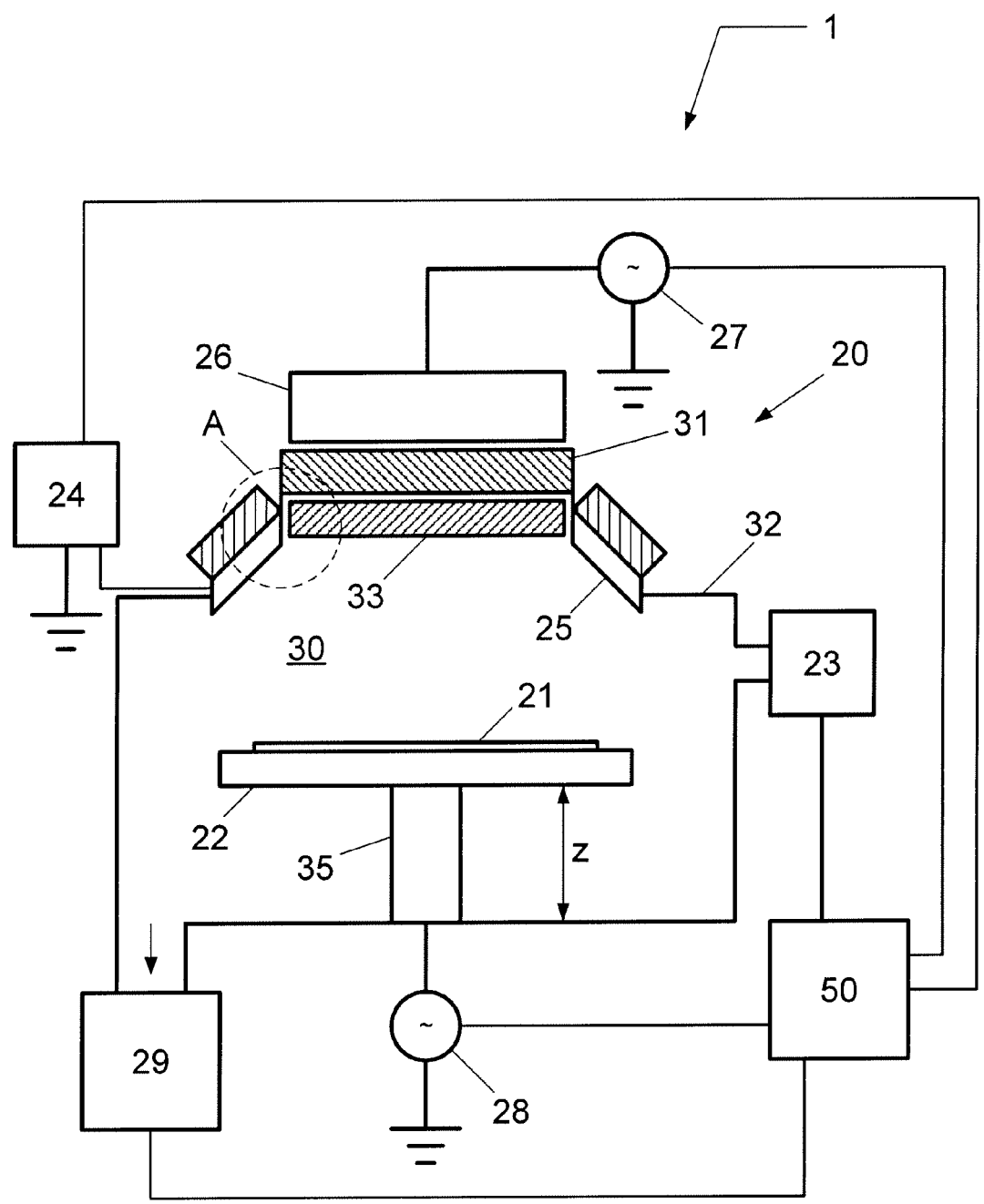
FIG. 1 depicts a schematic view of a deposition system.

Referring now to the drawings, wherein like reference numerals designate identical or corresponding parts throughout the several views, FIG. 1 illustrates a substrate processing system according to an embodiment. In the illustrated embodiment, the processing system comprises an ionized physical vapor deposition (iPVD) system 1. Although an iPVD system is depicted, other substrate processing systems are contemplated including other deposition systems as well as etching systems.

The iPVD system 1 comprises a process chamber 20, a gas supply system 23 coupled to a process chamber 20 and configured to introduce a process gas to process space 30 in process chamber 20, and a pressure control system 29 coupled to the process chamber 20 and configured to control the pressure within the process chamber 20. Additionally, the iPVD system 1 comprises a substrate holder 22 coupled to the process chamber 20 and configured to support a substrate 21.

Furthermore, the iPVD system 1 comprises a first radio frequency (RF) power source 27 coupled to the process chamber 20 and configured to form plasma from the process gas in the process space 30, a second RF power source 28 coupled to the process chamber 20 and configured to electrically bias the substrate 21, and a direct current (DC) power source 24 coupled to the processing chamber 20 and configured to electrically bias a target 25 for introducing an adatom to the process space 30 for deposition on the substrate 21.

As shown in FIG. 1, the first RF source 27 couples RF power to plasma formed in the process space 30 through a dielectric window 31 and a deposition baffle plate 33 using an antenna 26. RF power, supplied to the antenna 26 from the first RF source 27, can be inductively coupled to plasma in the process space 30. For example, the antenna 26 can include a two-dimensional or three dimensional inductive coil.

Also, as shown in FIG. 1, the iPVD system comprises a controller 50 coupled to the process chamber 20, the gas supply system 23, the pressure control system 29, the first RF power source 27, the second RF power source 28, and the DC power source 24. The controller 50 may be configured to perform at least one of monitoring, adjusting, or controlling any one of these system components.

Referring still to FIG. 1, the DC power source 24 couples DC power to the target 25 in order to electrically attract ion bombardment of the target 25 and thereby introduce or sputter adatom into process space 30. The target 25 may further include a magnet assembly 34 configured to enhance the population of ions local to the target 25 and cause increased sputtering rates. The target 25 can comprise a plate composed of the material desired for deposition on the substrate 21. For example, the target 25 may comprise a metal, such as copper for Cu iPVD, tantalum for Ta iPVD, or ruthenium for Ru iPVD. The target 25 may have an arbitrary shape, such as circular, ovular or ring-like. For example, the target 25 may comprise a frusto-conical ring as illustrated in FIG. 1.

The antenna 26 can be electrically connected to the first RF source 27 using an RF impedance matching network (not shown) in order to maximize or optimize the transfer of power from the first RF source 27 to plasma in the process space 30. The first RF source 27 can provide a time-varying RF current at a frequency between about 100 kHz and about 100 MHz that is supplied to the antenna 26 at a power ranging between about 100 watts and about 10,000 watts. For example, an operating frequency of approximately 13.56 MHz can be used. Alternately, other frequencies can be used. When energized by the first RF power source 27, the antenna 26 radiates an RF electromagnetic (EM) field. A metallic outer enclosure or cage (not shown) can be used to surround the antenna to confine the radiated RF electromagnetic field therein to ensure the safety of nearby persons and to prevent electromagnetic interference with surrounding electronics.

Furthermore, the antenna 26 can be positioned outside of the process chamber 20 behind a dielectric window 31 in the chamber wall 32. A deposition baffle 33, preferably formed of a slotted metallic material, is located inside of the chamber 20 closely spaced from the window 31 to shield the window 31 from deposition. The controller 50 can be used to perform at least one of monitoring, adjusting, or controlling the amount of ICP power applied to the antenna 26. For example, ICP power from the first RF power source 27 to the antenna 26 can be switched between different power levels during the deposition process.

The magnet assembly 34 can be located behind the target 25 and can be used to produce and/or change a static magnetic field shape in a process volume within the chamber. Field lines from the magnets extend into the process volume. In various embodiments, these or other field lines present in the chamber for purposes of enhancing the process may be caused to change, when switching between different modes, by controlling the magnet configuration or other parameters. Such magnet changes can include physically moving the magnet or any component thereof, for example, toward or away from the substrate, or toward or away from other parts of the coating material source, or by rotating or otherwise reorienting the magnet or magnet component. In the alternative, or in addition, an electromagnet or electromagnet component may be used in which the current is switched or otherwise varied when switching between deposition and etch modes.

In most cases, it may be preferable to employ stronger static magnetic fields reaching into the chamber during deposition, particularly during sputter deposition, rather than during etching.

An exemplary iPVD system is described in U.S. Pat. No. 6,287,435; this patent is hereby expressly incorporated herein by reference.

The iPVD system 1 also comprises a substrate holder 22 that is coupled to the process chamber 20 using a vertical-motion drive system 35. The drive system 35 can be used to adjust the substrate-to-source distance to affect changes in deposition uniformity, film coverage, film sidewall profile, etc. The controller 50 can be used to determine the Target-to-Substrate (TS) separation distances required during the deposition process and provide control data to the drive system 35 when it is required. During a deposition process, the substrate-to-source distance can typically be 100 to 300 mm.

The substrate holder 22 can accommodate a 200 mm substrate, a 300 mm substrate, or a larger substrate. For example, the substrate 21 can be transferred into and out of the process chamber 20 through an opening (not shown) that is controlled by a gate valve assembly (not shown). In addition, the substrate 21 can be transferred on and off the substrate holder 22 using a robotic substrate transfer system (not shown). In addition, the substrate 21 can be received by substrate lift pins (not shown) housed within the substrate holder 22 and mechanically translated by devices housed therein. Once the substrate 21 is received from the transfer system, it can be lowered to an upper surface of the substrate holder 22.

During processing, the substrate 21 can be held in place on the upper surface of the substrate holder 22. The substrate 21 may be electrically or mechanically clamped to the substrate holder 22. For example, the substrate 21 can be affixed to the substrate holder 22 via an electrostatic clamping system or electrostatic chuck (ESC).

Furthermore, the substrate holder 22 can further include a temperature control system for controlling the temperature of the substrate 21 during various deposition or etching processes. For example, during an iPVD process, the temperature control system can adjust and control the substrate temperature at substantially below room temperature, preferably below 0°, preferably to about −30° Celsius.

The substrate holder 22 can comprise a temperature control system having a cooling system or a heating system or both. For instance, the cooling system or heating system can include a re-circulating fluid flow that receives heat from the substrate holder 22 and either transfers heat to a heat exchanger system (not shown) when cooling or transfers heat from the heat exchanger system to the fluid flow when heating. Additionally, for instance, the cooling system or heating system may comprise heating/cooling elements, such as resistive heating elements, or thermo-electric heaters/coolers located within the substrate holder 22.

Moreover, the substrate holder 22 can facilitate the delivery of heat transfer gas to the backside of the substrate 21 via a backside gas supply system to improve the gas-gap thermal conductance between the substrate 21 and the substrate holder 22. Such a system can be utilized when temperature control of the substrate 21 is required at elevated or reduced temperatures. For example, the backside gas system can comprise a two-zone gas distribution system, wherein the backside gas (e.g., helium) pressure can be independently varied between the center and the edge of the substrate 21.

In other embodiments, heating/cooling elements, such as resistive heating elements, or thermo-electric heaters/coolers can be included in the chamber wall of the process chamber 20 and any other component within the iPVD system 1.

RF bias power can be supplied to the substrate holder 22 using the second RF power source 28 and can be used to provide a substrate bias. The controller 50 can be used to determine the amount of RF bias power to provide and when to have it applied to the substrate holder 22. For example, RF bias power can be turned on to a level appropriate during deposition to control the bias on the substrate 21 to adjust the deposition or etching process.

The operating frequency for the second RF power source 28 can range from 1 MHz to 100 MHz. The second RF power source 28 can be used to selectively apply a bias potential that accelerates positively charged plasma components toward the substrate. The bias potential provided by the second RF power source 28 substantially determines the kinetic energies of positive ions attracted to the substrate from the plasma. The second RF power source 28 typically operates at a frequency of about 13.56 MHz and at a power between about 100 watts and about 1000 watts. It is understood by those of ordinary skill in the art that the second RF power source 28 may be omitted from the processing system and the substrate holder 22 may be either grounded or electrically floating. Alternately, other frequencies can be used, such as 2 MHz or 27 MHz.

Process gas can be provided to the process chamber 20 by the gas supply system 23. The process gas can comprise a metal-containing gas, an inert gas, or a combination thereof. The inert gas may be a noble gas, such as argon, xenon, or krypton, but may also be any other inert gas or may be a non-inert gas that is compatible with the process.

Chamber pressure can be controlled using the pressure control system 29. For example, process gas can be supplied into the process chamber 20 by the gas supply system 23. The chamber pressure can be maintained at a pre-determined pressure by the pressure control system 29. The controller 50 can be used to control the flow rate and chemistry for the process gas and to control the chamber pressure accordingly.

DC power can be supplied from the DC power source 24 to the target 25. The controller 50 can be used to determine the amount of DC power to provide and when to have it applied to the target 25. After a certain desired amount of deposition, the DC power 24 to the target 25 is reduced or turned off to substantially reduce or stop the deposition process. In some cases, the deposition process can be substantially reduced and/or stopped by reducing the DC power level 24 to a very low level without completely turning it off.

The controller 50 can be configured to provide control data to the system components and receive process and/or status data from the system components. For example, the controller 50 can comprise a microprocessor, a memory (e.g., volatile or non-volatile memory), and a digital I/O port capable of generating control voltages sufficient to communicate and activate inputs to the iPVD system 1 as well as monitor outputs from the iPVD system 1. Moreover, the controller 50 can exchange information with the system components, and a program stored in the memory can be utilized to control the aforementioned components of an iPVD system 1 according to a process recipe. In addition, the controller 50 can be configured to analyze the process and/or status data, to compare the process and/or status data with target process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2:
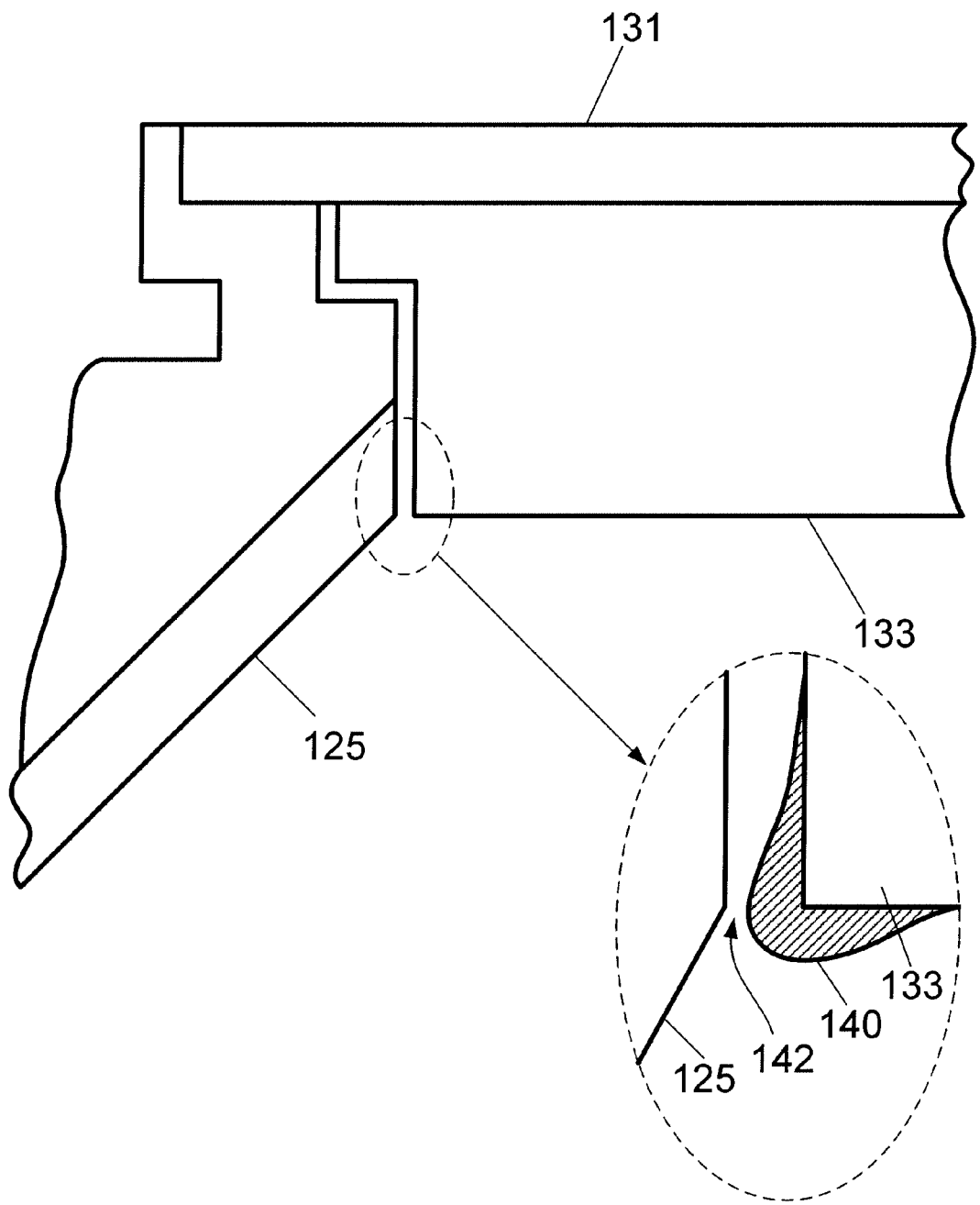
FIG. 2 depicts an exploded view of a portion of the deposition system depicted in FIG. 1.

Referring now to FIG. 2, an exploded view of portion A of the deposition system depicted in FIG. 1 is provided. The view in FIG. 2 illustrates a target 125 separated from a deposition baffle 133 by a clearance space 142. RF power from an antenna (not shown) may be coupled through a dielectric window 131 and deposition baffle 133 to form and maintain plasma in a process space within the deposition system. The formation of a population of ions adjacent the target 125 facilitates the introduction of sputtered material (or adatom) from the target 125 to the process space when ions are attracted to and impinge on the surface of the target 125 with energy levels exceeding the sputtering threshold of the target material.

Some fraction of the sputtered adatom is deposited on the substrate (as in PVD) or some fraction of the sputtered adatom is ionized and deposited on the substrate (as in iPVD). However, some of the sputtered adatom also deposits and accumulates on chamber surfaces within the deposition system. For example, as illustrated in FIG. 2, sputtered adatom may agglomerate at the edge of the deposition baffle forming an overhang 140 and may cause the pinching of the clearance space 142. In extreme cases, excessive deposition of the sputtered adatom at the edge of the deposition baffle 133 can extend the overhang to within sufficient proximity of the target 125. When the target 125 and the deposition baffle 133 are at different electrical potentials, as in a sputtering system, the reduced clearance associated with the overhang can lead to arcing. Further, such a small clearance space 142 is often necessary to provide optimum operation of the sputtering system. Thus, to prevent such a catastrophic event from occurring, the deposition system is frequently cleaned or refurbished with new replacement parts in order to remove these deposits.

Figure 3:
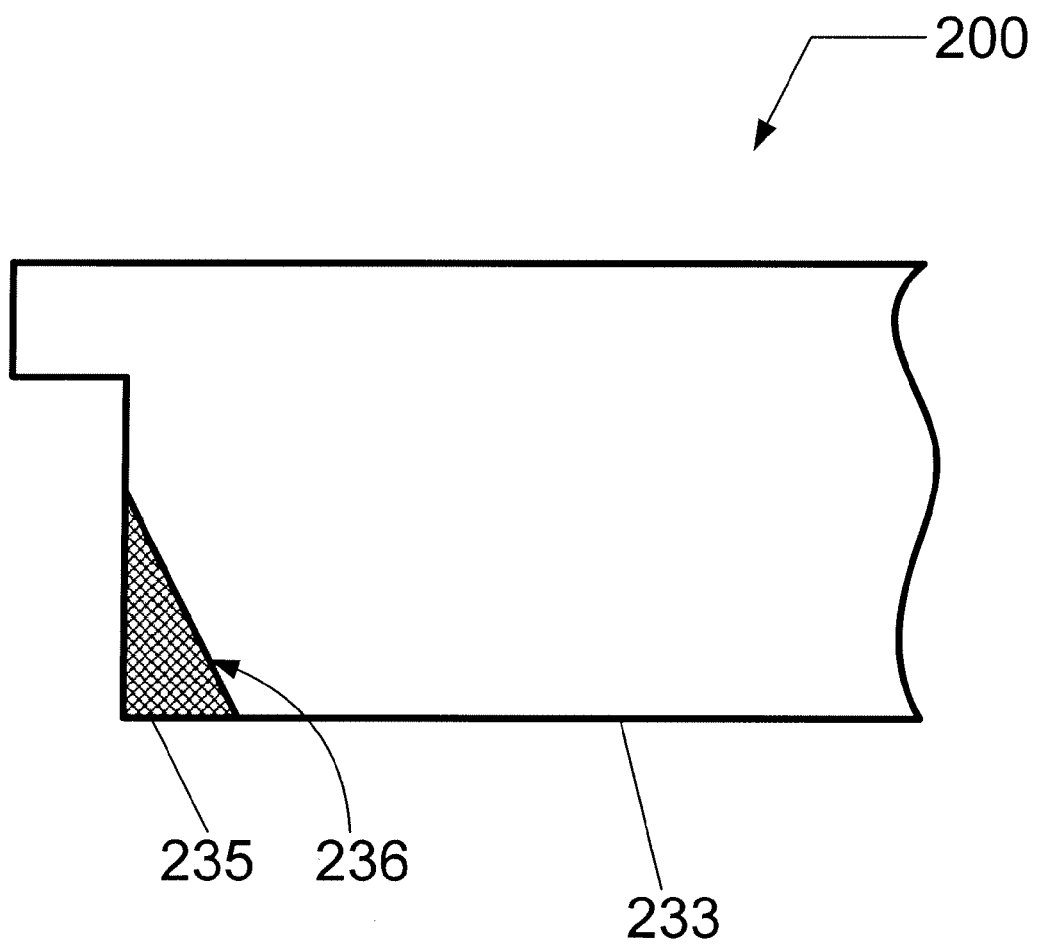
FIG. 3 provides a cross-sectional view of a chamber component according to an embodiment.

According to one embodiment, chamber components that may be susceptible to the accumulation of such deposits are equipped with deposit absorbing members that can absorb the deposits and extend the lifetime of the components. As shown in FIG. 3, a chamber component 200 is depicted, wherein the chamber component 200 comprises a primary member 233 and a deposit absorbing member 235 coupled to the primary member 233. The shape of the deposit absorbing member 235 can be arbitrary. For example, it may be ring-like, as depicted in FIG. 3, or it may be a disc of material.

The primary member 233 may, for example, include a deposition baffle. The deposition baffle may be fabricated from a conductive, non-conductive, or semi-conductive material. For instance, the deposition baffle may be fabricated from a metal, which may or may not further include a protective surface coating. The deposit absorbing member 235 may include a porous material, such as an open-celled foam structure. For example, the porous material may include Duocel® Aluminum Foam that is commercially available from ERG Materials and Aerospace Corporation (900 Stanford Avenue, Oakland, CA 94608). The foam may be fabricated from aluminum and aluminum alloys of 6101 and A356, as well as with other alloys, for example. The foam may be fabricated from other materials, including other metals such as copper or nickel.

Additionally, the foam may be fabricated to have a specific foam density, pore size, or ligament structure. For example, the foam density can range from approximately 3% to approximately 60% of the density of the solid base material. In a non-limiting embodiment, a foam density of approximately 15% to approximately 50% and, desirably, approximately 20% to approximately 40%, is used. Additionally, for example, the pore size can range from approximately 5 pores to approximately 60 pores per linear inch. In a non-limiting embodiment, a pore size of approximately 25 pores to approximately 55 pores per linear inch and, desirably, approximately 30 pores to approximately 50 pores per linear inch, is used.

Referring still to FIG. 3, the deposit absorbing member 235 may be coupled to the primary member 233 at an interface 236 via a brazing process or other adhesive process.

Figure 4:
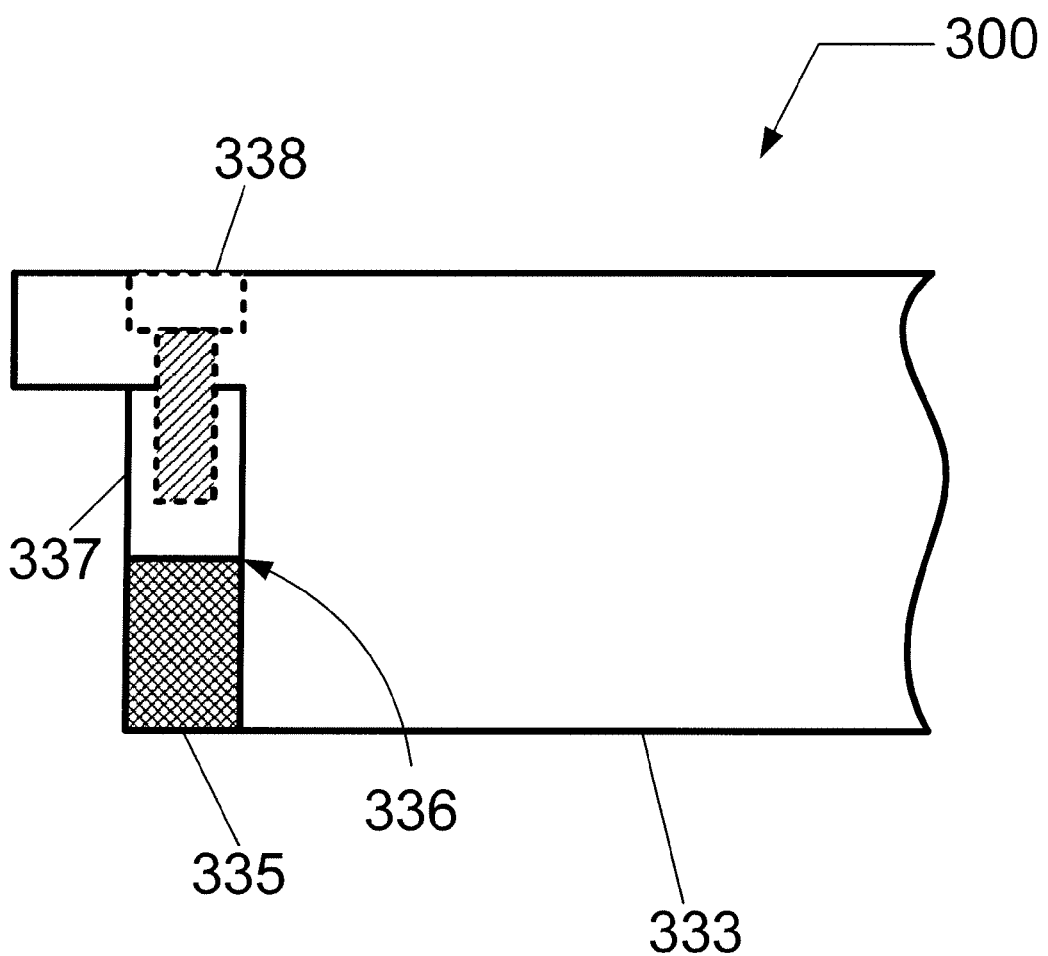
FIG. 4 provides a cross-sectional view of a chamber component according to another embodiment.

According to another embodiment, as shown in FIG. 4, a chamber component 300 is depicted, wherein the chamber component 300 comprises a primary member 333 and a deposit absorbing member 335 coupled to the primary member 333. Therein, the deposit absorbing member 335 may be brazed to an attachment member 337, which in turn may be coupled to the primary member 333 via a fastening device 338, such as a bolt.

Figure 5:
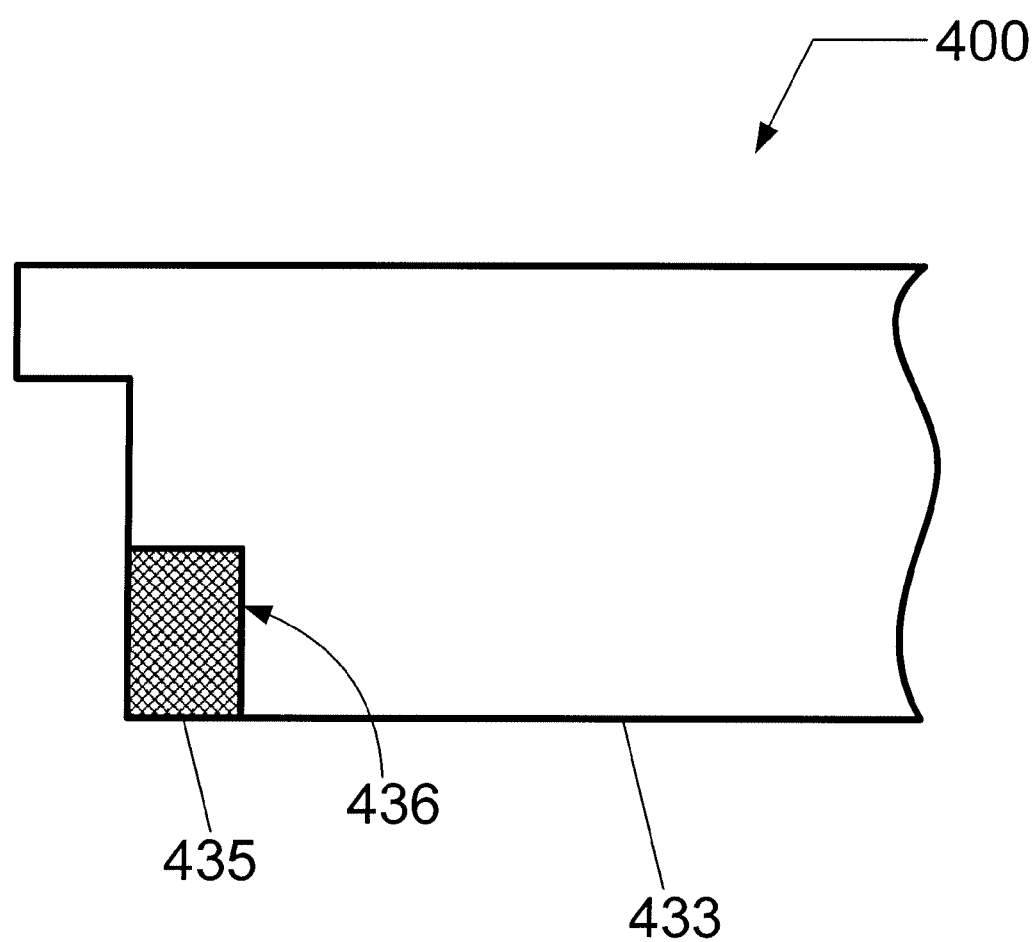
FIG. 5 provides a cross-sectional view of a chamber component according to another embodiment.

According to another embodiment, as shown in FIG. 5, a chamber component 400 is depicted, wherein the chamber component 400 comprises a primary member 433 and a deposit absorbing member 435 coupled to the primary member 433. Therein, the deposit absorbing member 435 may be either press fit or thermally fit upon the primary member 433 at an interface 436.

Figure 6:
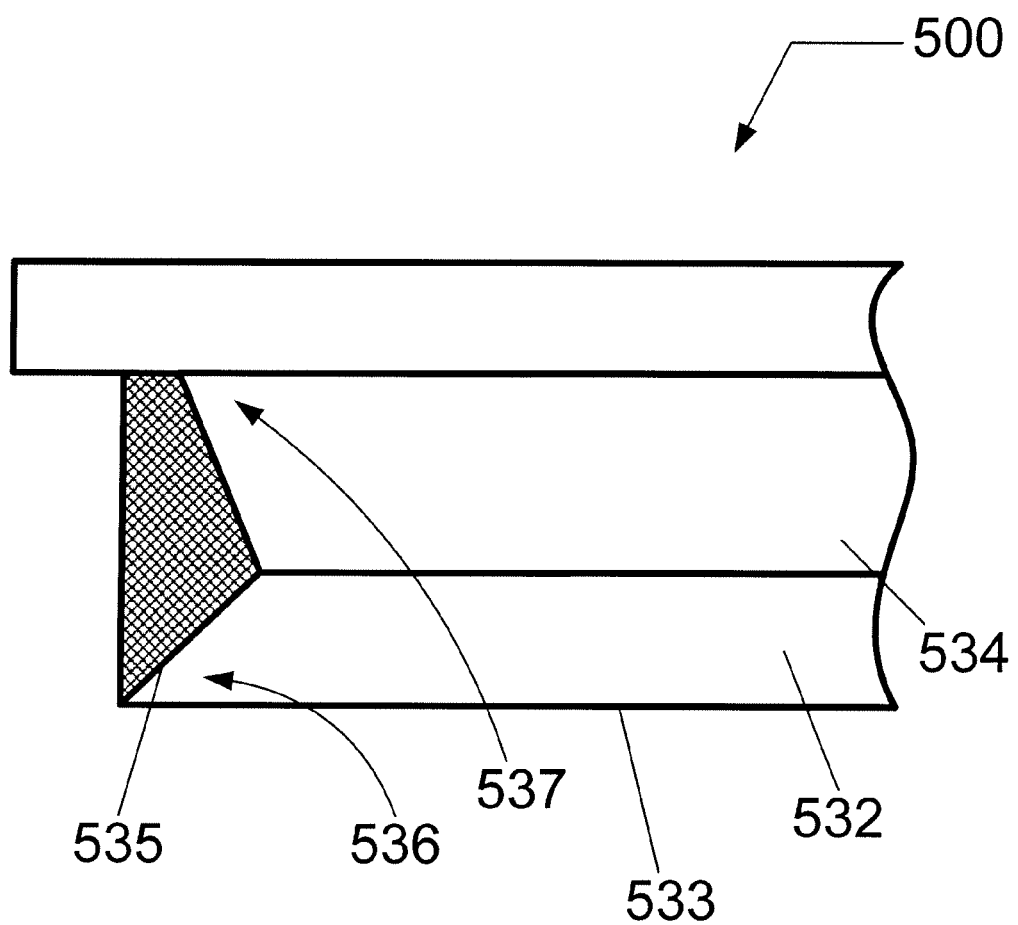
FIG. 6 provides a cross-sectional view of a chamber component according to another embodiment.

According to yet another embodiment, as shown in FIG. 6, a chamber component 500 is depicted, wherein the chamber component 500 comprises a primary member 533 and a deposit absorbing member 535 coupled to the primary member 533. The primary member 533 can comprise a first retention member 532 and a second retention member 534, each retention member 532, 534 having a first and second retention surface 536 and 537, respectively. When the first retention member 532 and the second retention member 534 are coupled to one another, the first and second retention surfaces 536, 537 can capture the deposit absorbing member 535 therebetween. For instance, the first and second retention surfaces 536, 537 may include angled interfaces as shown in FIG. 6.

Figure 7:
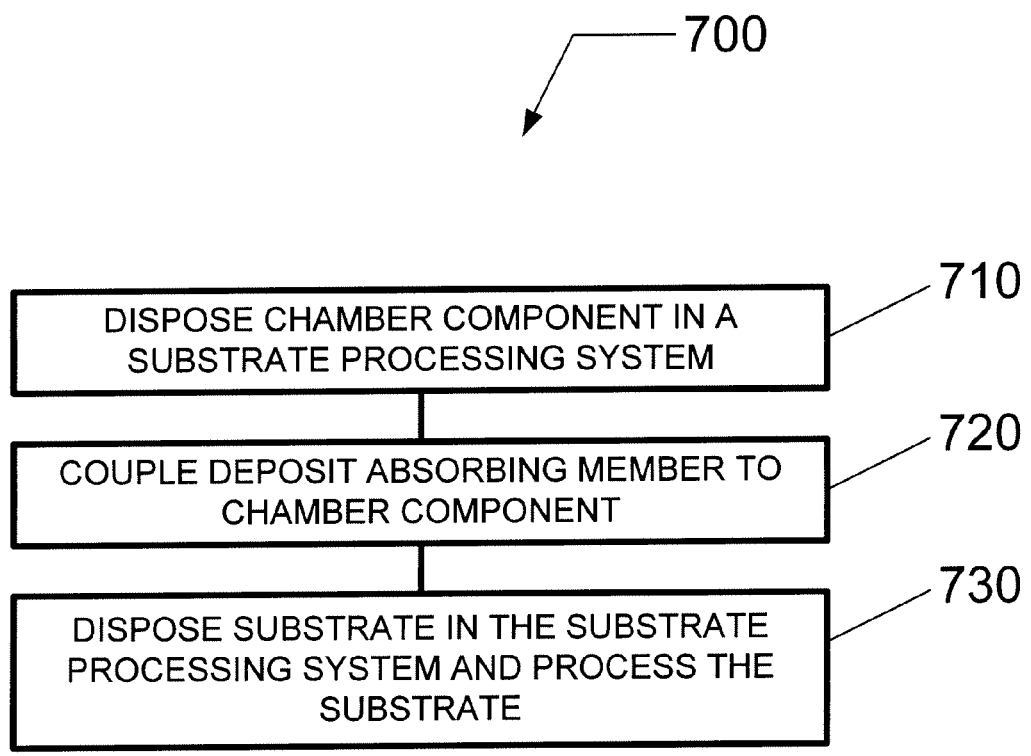
FIG. 7 illustrates a method of depositing a thin film on a substrate according to yet another embodiment.

Referring now to FIG. 7, a method of processing a substrate is illustrated according to yet another embodiment. The method 700 includes, at 710, disposing a chamber component in a substrate processing system. The chamber component can include any chamber component exposed to the process performed within the substrate processing system. For example, the chamber component can include a deposition baffle, a baffle plate, an electrode plate, a gas injection plate, a chamber liner or deposition shield, a shield ring, a focus ring, etc. Additionally, for example, the processing system may include a deposition system wherein sputtered material or precursor material or by-products of the deposition process accumulate on the surfaces of the chamber component. Additionally, for example, the processing system may include an etching system wherein etch by-products may accumulate on the surfaces of the chamber component.

In 720, a deposit absorbing member is coupled to the chamber component. The deposit absorbing member can absorb material deposits and extend the life of the chamber component. In one embodiment, the absorbing material is coupled to the chamber component at a predetermined location that is prone to agglomeration of deposits and/or problems caused by such agglomeration. As described above, for example, the absorbing material may be placed on a component surface that is in close proximity to another component surface having a different electrical potential.

In 730, a substrate is provided in the substrate processing system for processing. The substrate can be of any size, for example a 200 mm substrate, a 300 mm substrate, or an even larger substrate. For example, the substrate may be subjected to a deposition or etching process.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A chamber component for a substrate processing system, comprising:
a primary member including a deposition baffle configured to cover a dielectric window of the substrate processing system, the deposition baffle having openings configured to pass RF energy that enters a chamber through the dielectric window, said openings being configured to impede deposition material from passing therethrough and reaching the dielectric window, the deposition baffle having a baffle edge adjacent to a sputtering target; and
a deposit absorbing member disposed to cover the baffle edge between the deposition baffle and the sputtering target, wherein said deposit absorbing member comprises a porous material configured to absorb material that is deposited on a surface thereof.

2. The chamber component of claim 1, wherein said deposit absorbing member comprises a metal foam or metal alloy foam.

3. The chamber component of claim 1, wherein said deposit absorbing member comprises a non-metal foam.

4. The chamber component of claim 2, wherein said deposit absorbing member comprises an aluminum foam or aluminum alloy foam.

5. The chamber component of claim 4, wherein said deposit absorbing member is coupled to said primary member via a braze joint or an adhesive.

6. The chamber component of claim 5, wherein the density of said porous materials ranges from approximately 20% to approximately 40% of the density of the solid base material.

7. The chamber component of claim 1, wherein the density of said porous material ranges from approximately 3% to approximately 60% of the density of the solid base material of said porous material.

8. The chamber component of claim 1, wherein the pore density of said porous material ranges from approximately 5 pores per linear inch to approximately 60 pores per linear inch.

9. The chamber component of claim 1, wherein said deposit absorbing member is coupled to said primary member via a braze joint or an adhesive.

10. The chamber component of claim 1, wherein said deposit absorbing member is coupled to said primary member using a fastening device.

11. The chamber component of claim 10, wherein said fastening device comprises one or more bolts.

12. The chamber component of claim 1, wherein said deposit absorbing member is coupled to said primary member via press fitting or thermal fitting.

13. The chamber component of claim 1, wherein said primary member comprises a first retention member and a second retention member, said first retention member comprises a first retention surface and said second retention member comprises a second retention surface, and wherein said deposit absorbing is captured and retained between said first retention surface and said second retention surface when said first retention member is coupled to said second retention member.

14. The chamber component of claim 1, wherein said primary member further comprises a baffle plate, an electrode plate, a gas injection plate, a chamber liner or deposition shield, a shield ring, or a focus ring.

15. The chamber component of claim 1, wherein said primary member is coupled to the interior of a deposition system or an etching system.

16. The chamber component of claim 1, wherein
said deposit absorbing member covers said baffle edge to reduce buildup of sputtered adatom at the baffle edge and to prevent arcing between the deposition baffle and the sputtering target.

17. A sputtering system for depositing a thin film on a substrate, comprising:
a dielectric window configured to permit RF energy therethrough;
a sputtering target coupled to said sputtering system and configured to introduce a sputtered adatom to said sputtering system for deposition on said substrate; and
a chamber component coupled to said sputtering system adjacent to said sputtering target, said chamber component comprising:
a primary member including a deposition baffle provided over the dielectric window and having openings configured to pass the RF energy from the dielectric window while impeding deposition of material on the dielectric window, the deposition baffle being adjacent to the sputtering target at a baffle edge, and
a deposit absorbing member disposed to cover the baffle edge between the deposition baffle and the sputtering target proximate to said sputtering target, wherein said deposit absorbing member comprises a porous material configured to absorb material that is deposited on a surface thereof.

18. The sputtering system of claim 17, wherein said deposit absorbing member comprises a metal foam or metal alloy foam.

19. The sputtering system of claim 17, wherein said deposit absorbing member comprises a non-metal foam.

20. The sputtering system of claim 18, wherein said deposit absorbing member comprises an aluminum foam or aluminum alloy foam.

21. A method of processing a substrate in a substrate processing system, the method comprising:
disposing a chamber component including a deposition baffle within said substrate processing system, the deposition baffle being provided over a dielectric window and adjacent to a sputtering target at a baffle edge, wherein the deposition baffle having openings configured to pass RF energy from the dielectric window while impeding deposition of material on the dielectric window;
coupling a deposit absorbing member to said chamber component to cover the baffle edge between the deposition baffle and the sputtering target, wherein said deposit absorbing member comprises a porous material configured to absorb material that is deposited on a surface thereof in said substrate processing system;
providing a substrate in said substrate processing system; and
processing said substrate.

22. The method of claim 21, wherein processing said substrate comprises depositing a thin film on said substrate.

23. The method of claim 21, wherein coupling said deposit absorbing member to said chamber component comprises coupling a metal foam or a metal alloy foam to said chamber component.

24. The method of claim 21, wherein said coupling said deposit absorbing member to said chamber component comprises coupling a non-metal foam to said chamber component.

25. The method of claim 23, wherein said coupling said deposit absorbing member to said chamber component comprises coupling an aluminum foam or an aluminum alloy foam to said chamber component.

26. The method of claim 21, wherein said deposit absorbing member is disposed at said baffle edge between the deposition baffle and the sputtering target to reduce buildup of sputtered adatom, produced during substrate processing, at the baffle edge and to prevent arcing between the deposition baffle and the sputtering target.

27. The sputtering system of claim 17, wherein said deposit absorbing member is disposed to cover said baffle edge between the deposition baffle and the sputtering target to reduce buildup of the sputtered adatom at the baffle edge and to prevent arcing between the deposition baffle and the sputtering target.

* * * * *